United States Patent
Kawano et al.

(10) Patent No.: US 10,008,935 B2
(45) Date of Patent: Jun. 26, 2018

(54) DC-DC CONVERTER

(71) Applicant: SII Semiconductor Corporation, Chiba-shi, Chiba (JP)

(72) Inventors: Akihiro Kawano, Chiba (JP); Katsuya Goto, Chiba (JP)

(73) Assignee: ABLIC INC., Chiba (JP)

( * ) Notice: Subject to any disclaimer, the term of this patent is extended or adjusted under 35 U.S.C. 154(b) by 0 days. days.

(21) Appl. No.: 15/497,725

(22) Filed: Apr. 26, 2017

(65) Prior Publication Data

US 2017/0317590 A1   Nov. 2, 2017

(30) Foreign Application Priority Data

Apr. 28, 2016   (JP) .................................. 2016-091200

(51) Int. Cl.
| | |
|---|---|
| *H02M 1/32* | (2007.01) |
| *H02M 3/158* | (2006.01) |
| *G01K 3/00* | (2006.01) |
| *G01R 19/165* | (2006.01) |

(52) U.S. Cl.
CPC ............ *H02M 3/158* (2013.01); *G01K 3/005* (2013.01); *G01R 19/16576* (2013.01); *H02M 1/32* (2013.01); *H02M 2001/327* (2013.01)

(58) Field of Classification Search
CPC .......... H02M 1/32; H02M 1/36; H02M 3/156; H02M 3/158; H02M 2001/32; H02M 2001/327; H02M 2003/156; G01K 3/005; G01R 19/16576
See application file for complete search history.

(56) References Cited

U.S. PATENT DOCUMENTS

| | | | | |
|---|---|---|---|---|
| 7,379,310 B2* | 5/2008 | Louvel | .................... | H02M 1/32 361/18 |
| 7,482,877 B2* | 1/2009 | Kim | ...................... | H03F 1/0205 330/207 P |
| 7,940,030 B2* | 5/2011 | Cannella | .................. | H02M 1/32 323/222 |
| 2004/0227498 A1 | 11/2004 | Okada | | |
| 2005/0078404 A1* | 4/2005 | Kuramoto | ................ | G11B 5/54 360/75 |
| 2005/0253568 A1 | 11/2005 | Morimoto | | |
| 2009/0034302 A1 | 2/2009 | Cannella et al. | | |
| 2011/0140636 A1 | 6/2011 | Adams et al. | | |
| 2012/0134378 A1 | 5/2012 | Kamatani | | |
| 2013/0083562 A1* | 4/2013 | Wu | ........................ | H02M 1/32 363/16 |
| 2016/0043627 A1* | 2/2016 | Chen | ................... | H02M 3/1584 323/271 |

OTHER PUBLICATIONS

Office Action in U.S. Appl. No. 14/497,613, dated Sep. 26, 2017, 8 pages.

* cited by examiner

*Primary Examiner* — Matthew Nguyen

(74) *Attorney, Agent, or Firm* — Brinks Gilson & Lione

(57) ABSTRACT

There is provided a DC-DC converter which is safe and secure, but yet with low power consumption. The DC-DC converter is configured to monitor the output voltage of an error amplifier, and detect that the output voltage of the error amplifier becomes a fixed value or smaller to drive an overheat protection circuit and a supply voltage monitoring circuit intermittently.

5 Claims, 4 Drawing Sheets

DC-DC CONVERTER

RELATED APPLICATIONS

This application claims priority under 35 U.S.C. § 119 to Japanese Patent Application No. 2016-091200 filed on Apr. 28, 2016, the entire content of which is hereby incorporated by reference.

BACKGROUND OF THE INVENTION

Field of the Invention

The present invention relates to a DC-DC converter, and particularly to a technique for reducing current consumption under light load.

Background Art

Recently, the power consumption of an electronic device equipped with a battery has been increasingly reduced. Particularly, an electronic device such as a smartphone, a mobile device, or a wearable device has been required to reduce power consumption more and more in order to make the drive time longer. Therefore, a semiconductor integrated circuit incorporated in the electronic device is also required to reduce power consumption significantly.

In the meantime, the safety of an electronic device, such as a mobile device directly handled by a person, not to affect the human body adversely like an explosion or electric shock is particularly required.

For example, a DC-DC converter incorporated in a battery-driven electronic device to operate at the battery voltage includes an overheat protection circuit that stops the operation when the chip temperature in a semiconductor integrated circuit rises and reaches a temperature equal to or higher than a predefined temperature, a supply voltage monitoring circuit that prevents the malfunction of an internal circuit when the battery voltage drops significantly, and the like (for example, see Patent Document 1).

[Patent Document 1] Japanese Patent Application Laid-Open No. 2005-328589

SUMMARY OF THE INVENTION

An object of the present invention is to provide a DC-DC converter which is safe and secure, but yet with low power consumption.

According to one embodiment of the present invention, there is provided a DC-DC converter including: a switching element connected between one end of an inductor, which includes another end at which an output voltage is generated, and a input terminal of the DC-DC converter; an error amplifier that monitors the output voltage; an output control circuit that outputs a control signal to the gate of the switching element based on an output signal of the error amplifier; and a protection circuit that outputs a signal to the output control circuit when detecting an abnormal state to turn off the switching element, wherein the protection circuit performs intermittent operation to operate only for a predetermined period of time in response to a signal based on the output signal of the error amplifier.

Since the DC-DC converter of the present invention is configured to operate the protection circuit intermittently only for the predetermined period, the current consumption under light load can be particularly reduced, and hence power efficiency can be improved.

DETAILED DESCRIPTION OF THE PREFERRED EMBODIMENT

Figure 1:
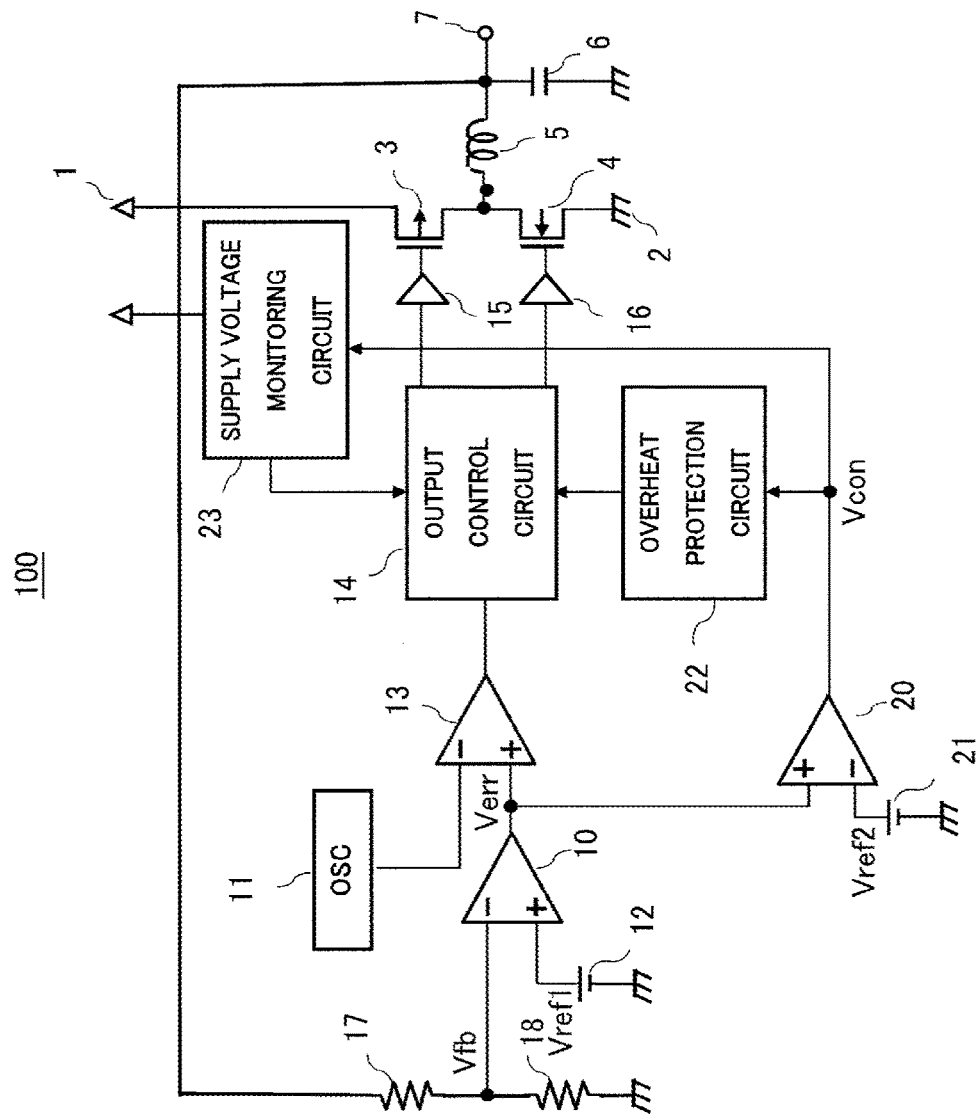
FIG. 1 is a circuit diagram illustrating an example of a DC-DC converter of an embodiment of the present invention.

FIG. 1 is a circuit diagram illustrating an example of a DC-DC converter of an embodiment. A DC-DC converter 100 is a synchronous rectification type DC-DC converter that converts, to constant voltage, supply voltage Vin input to an input terminal 1, and outputs the voltage to an output terminal 7 as output voltage Vout.

The DC-DC converter 100 of the embodiment includes a PMOS transistor 3 as a first switching element, an NMOS transistor 4 as a second switching element, an inductor 5, an output capacitor 6, an error amplifier 10, an oscillation circuit 11, reference voltage circuits 12 and 21, comparators 13 and 20, an output control circuit 14, buffer circuits 15 and 16, voltage-dividing resistors 17 and 18, an overheat protection circuit 22, and a supply voltage monitoring circuit 23.

The voltage-dividing resistors 17 and 18 output feedback voltage Vfb corresponding to the output voltage Vout. The reference voltage circuit 12 outputs reference voltage Vref1. The error amplifier 10 compares the feedback voltage Vfb with the reference voltage Vref1, and outputs, to the comparators 13 and 20, voltage Verr obtained by amplifying a difference between the feedback voltage Vfb and the reference voltage Vref1. The oscillation circuit 11 outputs a constant-period triangular wave signal. The comparator 13 compares the triangular wave signal of the oscillation circuit 11 with the voltage Verr of the error amplifier 10, and outputs a signal as the comparison result. The output control circuit 14 receives the output signal of the comparator 13, and outputs a control signal to the buffer circuits 15 and 16. The buffer circuit 15 controls the PMOS transistor 3, and the buffer circuit 16 controls the NMOS transistor 4.

The reference voltage circuit 21 outputs reference voltage Vref2. The comparator 20 compares the voltage Verr of the error amplifier 10 with the reference voltage Vref2, and outputs a control signal Vcont. When the voltage Verr of the error amplifier 10 exceeds the reference voltage Vref2, the comparator 20 outputs the control signal Vcont to the overheat protection circuit 22 and the supply voltage monitoring circuit 23 to stop the operation.

The overheat protection circuit 22 monitors the temperature of the DC-DC converter, and outputs a signal to the output control circuit 14 when determining an overheated state as a result of heating the DC-DC converter. The output control circuit 14 that received the signal from the overheat protection circuit 22 turns off the PMOS transistor 3 through the buffer circuit 15 to protect a breakdown of the DC-DC converter by heating.

The supply voltage monitoring circuit 23 monitors supply voltage, and outputs a signal to the output control circuit 14 when determining that the supply voltage drops lower than a predetermined voltage. When receiving the signal from the supply voltage monitoring circuit 23, the output control circuit 14 turns off the PMOS transistor 3 through the buffer circuit 15. Thus, the supply voltage monitoring circuit 23 prevents a breakdown of the DC-DC converter by unintended switching operation.

Figure 2A:
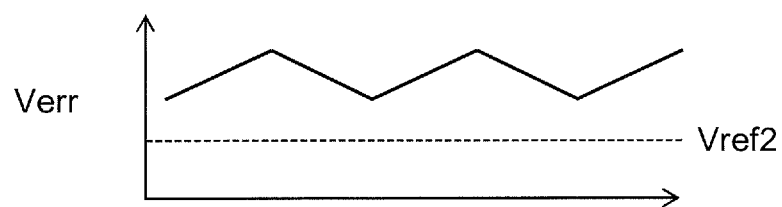
FIG. 2A is a timing chart illustrating the operation of a comparator 20 under heavy load in the DC-DC converter of the embodiment.
Figure 2B:
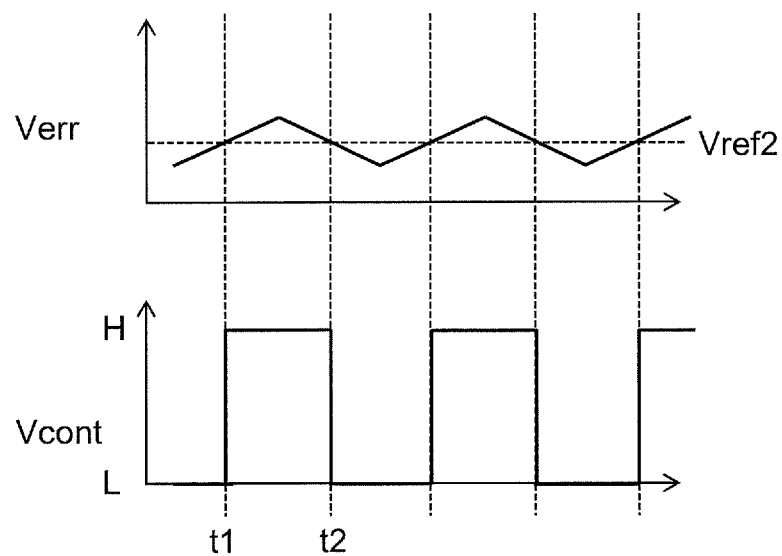
FIG. 2B is a timing chart illustrating the operation of the comparator 20 under light load in the DC-DC converter of the embodiment.

Referring next to timing charts of FIG. 2, the operation of the comparator 20 will be described. FIG. 2A illustrates a case of heavy load, where the load connected to the output terminal 7 is heavy, and FIG. 2B illustrates a case of light load, where the load connected to the output terminal 7 is light.

In the case of heavy load, since current output from the output terminal 7 increases, the output voltage Vout drops, i.e., the feedback voltage Vfb drops. Therefore, the voltage Verr of the error amplifier 10 rises so that the output of the comparator 13 will be an oscillation signal long in H period. Thus, the output control circuit 14 outputs a signal long in L period to the gate of the PMOS transistor 3, and a signal long in H period to the gate of the NMOS transistor 4.

At this time, since the voltage Verr of the error amplifier 10 always exceeds the reference voltage Vref2 of the reference voltage circuit 21 as illustrated in FIG. 2A, the comparator 20 always outputs an H control signal Vcont. In response to this H signal, the overheat protection circuit 22 and the supply voltage monitoring circuit 23 always monitor the temperature and the supply voltage, respectively.

When the load is light, since the output voltage Vout rises, i.e., the voltage Verr of the error amplifier 10 drops, the output of the comparator 13 becomes an oscillation signal long in L period. Thus, the output control circuit 14 outputs the signal long in H period to the gate of the PMOS transistor 3, and the signal long in L period to the gate of the NMOS transistor 4.

At this time, since the voltage Verr of the error amplifier 10 drops to that equivalent to the reference voltage Vref2 of reference voltage circuit 21 as illustrated in FIG. 2B, the control signal Vcont of the comparator 20 varies between the H level and the L level depending on the magnitude of the voltage difference. In response to this control signal Vcont, the overheat protection circuit 22 and the supply voltage monitoring circuit 23 intermittently monitor the temperature and the supply voltage, respectively.

As described above, since the comparator 20 intermittently controls the operation of the overheat protection circuit 22 and the supply voltage monitoring circuit 23, the power consumption of the overheat protection circuit 22 and the supply voltage monitoring circuit 23 can be reduced.

Particularly, in the overheat protection circuit 22 under light load, since there is no danger of braking down any element due to a temperature rise by current flowing through the NMOS transistor 4, there is no problem that if the overheat protection circuit 22 is in a stopped state.

When an overheated state or a power drop state is determined, the overheat protection circuit 22 and the supply voltage monitoring circuit 23 continue detection operation until it is determined not to the overheated state or the power drop state. This operation can protect the DC-DC converter without fail even when the overheat protection circuit 22 and the supply voltage monitoring circuit 23 perform intermittent operation under light load.

Figure 3:
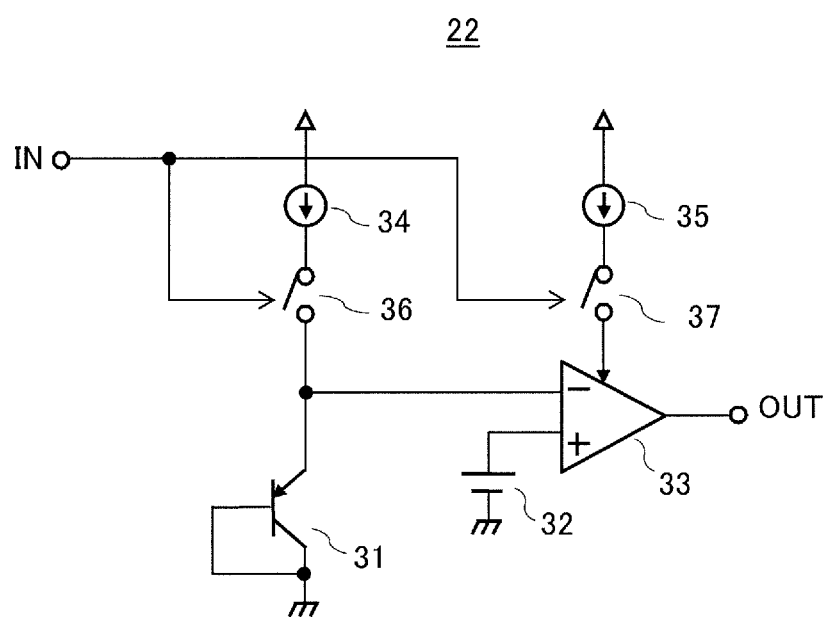
FIG. 3 is a circuit diagram illustrating an example of an overheat protection circuit in the DC-DC converter of the embodiment.

FIG. 3 is a circuit diagram illustrating an example of the overheat protection circuit of the present invention. The overheat protection circuit 22 includes a thermosensor 31, a reference voltage circuit 32, a comparator 33 that compares the voltage of the thermosensor 31 with the output voltage of the reference voltage circuit 32 to detect temperature, a bias circuit 34 that supplies current to the thermosensor 31, a bias circuit 35 that supplies current to the comparator 33, a switch 36 that controls the supply of current from the bias circuit 34 to the thermosensor 31, and a switch 37 that controls the supply of current from the bias circuit 35 to the comparator 33. The switch 36 is provided between thermosensor 31 and the bias circuit 34. The switch 37 is provided between the comparator 33 and the bias circuit 35.

When the H signal of the comparator 20 is input to an IN terminal, the switch 36 and the switch 37 are turned on to supply current to the thermosensor 31 and the comparator 33. After the current is supplied and the voltage of the thermosensor 31 and the comparator 33 are stabilized in a state where a comparison can be made, the comparator 33 compares the output voltage of the reference voltage circuit 32 with the voltage of the thermosensor 31 to determine the temperature. When an overheated state is determined, the bias circuits 34, 35 continue to supply current to the thermosensor 31 and the comparator 33 in order to continue the detection of temperature. When no overheated state is determined, an L signal is input according to a signal input to the IN terminal to turn off the switch 36 and the switch 37 so as to stop the supply of current to the thermosensor 31 and the comparator 33.

Figure 4:
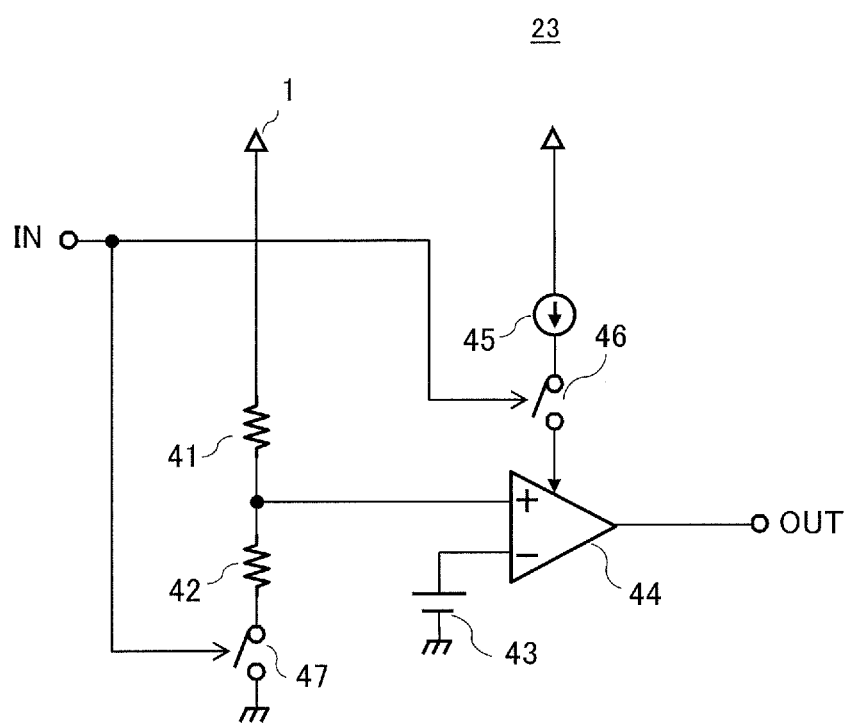
FIG. 4 is a circuit diagram illustrating an example of a supply voltage monitoring circuit in the DC-DC converter of the embodiment.

FIG. 4 is a circuit diagram illustrating an example of the supply voltage monitoring circuit of the present invention. The supply voltage monitoring circuit 23 includes voltage-dividing resistors 41, 42, a reference voltage circuit 43, a comparator 44 that latches an output signal, and a bias circuit 45. The supply voltage monitoring circuit 23 also includes a switch 46 that controls the supply of current from the bias circuit 45 to the comparator 44, and a switch 47 that shuts off the current flowing through the voltage-dividing resistors 41, 42.

In a state where the switches 46, 47 are off, the divided voltage of a voltage-dividing resistor circuit composed of the voltage-dividing resistors 41, 42 is pulled up to the supply voltage Vin.

When the H signal output from the comparator 20 is input to the IN terminal, the switch 46 and the switch 47 are turned on to supply current to the voltage-dividing resistors 41, 42, and the comparator 44. The comparator 44 compares the divided voltage with reference voltage of the reference voltage circuit 43 to monitor the supply voltage Vin. When the divided voltage is determined to be low voltage lower than the reference voltage value, the comparator 44 outputs the L signal from an OUT terminal. Then, power monitoring is continued until the divided voltage is determined not to be the low voltage. When the divided voltage becomes voltage higher than the reference voltage value, the comparator 44 outputs the H signal from the OUT terminal. On this occasion, the switches 46, 47 perform on/off operation based on a signal input from the comparator 20 to the IN terminal. When the switch 46 is off, the comparator 44 latches a signal when the switch is on to output an intermittent signal from the OUT terminal. The voltage in the supply voltage monitoring circuit 23 to determine whether the supply voltage Vin is the low voltage or not is decided based on the reference voltage value of the reference voltage circuit 43, and a voltage dividing ratio of the voltage-dividing resistor circuit.

In the above description, the supply voltage monitoring circuit monitors the supply voltage Vin to stop the operation of the DC-DC converter in order to protect the DC-DC converter, but it can also be applied to a monitoring circuit that monitors internal power supply to drive a control circuit in the DC-DC converter circuit.

The supply voltage monitoring circuit can further be applied to an OVP (Over Voltage Protection) circuit that monitors the output voltage Vout and detects an overvoltage state to stop the operation of the DC-DC converter.

Further, the supply voltage monitoring circuit can be applied to a UVP (Under Voltage Protection) circuit that detects a decrease in output voltage Vout to stop the operation of the DC-DC converter.

What is claimed is:

1. A DC-DC converter, comprising:
   a switching element connected between a first end of an inductor, and an input terminal of the DC-DC converter, the inductor having second end at which an output voltage is generated;
   an error amplifier that monitors the output voltage;
   an output control circuit that outputs a control signal to a gate of the switching element based on an output signal of the error amplifier; and
   a protection circuit that outputs a signal to the output control circuit to turn off the switching element when detecting an abnormal state,
   wherein the protection circuit operates intermittently only for a predetermined period of time in response to a signal based on the output signal of the error amplifier.

2. The DC-DC converter according to claim 1, wherein the predetermined period is a period during which at least the switching element is on.

3. The DC-DC converter according to claim 1, wherein the protection circuit comprises a supply voltage monitoring circuit that detects an abnormal state when the supply voltage is a predetermined voltage or lower.

4. The DC-DC converter according to claim 1, wherein the protection circuit comprises an overheat protection circuit that detects an abnormal state when an ambient temperature is a predetermined temperature or higher.

5. A DC-DC converter comprising:
   a switching element connected between a first end of an inductor, and an input terminal of the DC-DC converter, the inductor having a second end at which an output voltage is generated;
   an error amplifier that monitors the output voltage;
   an output control circuit that outputs a control signal to a gate of the switching element based on an output signal of the error amplifier;
   a protection circuit that outputs a signal to the output control circuit to turn off the switching element when detecting an abnormal state,
   wherein the protection circuit operates intermittently only for a predetermined period of time in response to a signal based on the output signal of the error amplifier; and
   a comparator that outputs a control signal to cause the protection circuit to operate intermittently based on the output signal of the error amplifier.

* * * * *